United States Patent [19]
Hong et al.

[11] Patent Number: 5,821,171
[45] Date of Patent: *Oct. 13, 1998

[54] ARTICLE COMPRISING A GALLIUM LAYER ON A GAAS-BASED SEMICONDUCTOR, AND METHOD OF MAKING THE ARTICLE

[75] Inventors: Minghwei Hong; Jueinai Raynien Kwo, both of Watchung; Joseph Petrus Mannaerts, Summit; Matthias Passlack, New Providence; Fan Ren, Warren; George John Zydzik, Columbia, all of N.J.

[73] Assignee: Lucent Technologies Inc., Murray Hill, N.J.

[ * ] Notice: The term of this patent shall not extend beyond the expiration date of Pat. Nos. 5,550,089 and 5,451,548.

[21] Appl. No.: 408,678

[22] Filed: Mar. 22, 1995

Related U.S. Application Data

[63] Continuation-in-part of Ser. No. 217,332, Mar. 23, 1994, Pat. No. 5,550,089.

[51] Int. Cl.$^6$ .................................................. H01L 21/316
[52] U.S. Cl. ............................................. 438/767; 438/779
[58] Field of Search .............................. 437/236; 438/767, 438/779

[56] References Cited

U.S. PATENT DOCUMENTS

| | | | |
|---|---|---|---|
| 4,001,858 | 1/1977 | Ballamy et al. | 357/14 |
| 4,859,253 | 8/1989 | Buchanan et al. | 438/767 |
| 4,994,140 | 2/1991 | Ksuzo et al. | 438/767 |
| 5,186,718 | 2/1993 | Tepman et al. | 29/25.01 |
| 5,451,548 | 9/1995 | Hunt et al. | 438/779 |
| 5,550,084 | 8/1996 | Dutta et al. | 438/779 |

OTHER PUBLICATIONS

"Investigation of the Mechanism for Schottky Barrier Formation by Group III Metal on GaAs(110)", by P. Skeath et al., J. Vac. Science and Technology, vol. 16(5), Sep./Oct. 1979, pp. 1143–1148, 1979.

"Oxide Layers on GaAs Prepared by Thermal, Anodic and Plasma Oxidation: In–depth Profiles and Annealing Effects", by K. Watanabe et al., Thin Solid Films, 56(1–2), pp. 63–73, 1979.

"Determination of the Oxygen Binding Site on GaAs (110) Using Soft–X–Ray–Photoemission Spectroscopy", by P. Pianetta et al., Physical Review Letters, vol. 35 (20), 17 Nov. 1975, pp. 1356–1359, 1975.

"Unified Defect Model and Beyond", by W.E. Spicer et al., J. Vac. Science and Technology, vol. 17(5), Sep./Oct. 1980, pp. 1019–1027.

"Determination of the Oxygen Binding Site on GaAs(110) Using Soft–X–Ray–Photoemission Spectroscopy", by P. Pianetta et al., Physical Review Letters, vol. 35 (20), 17 Nov. 1975, pp. 1356–1359.

(List continued on next page.)

Primary Examiner—Charles L. Bowers, Jr.
Assistant Examiner—Matthew Whipple
Attorney, Agent, or Firm—Eugen E. Pacher; Julio A. Garceran

[57] ABSTRACT

A high quality interface between a GaAs-based semiconductor and a $Ga_2O_3$ dielectric an be formed if the semiconductor surface is caused to have less than 1% of a monolayer impurity coverage at completion of the first monolayer of the $Ga_2O_3$ on the surface. This is achieved, for instance, by preparing the surface of a GaAs wafer under UHV conditions in a first growth chamber, transferring the wafer through a transfer module under UHV to a second growth chamber that is also under UHV, and growing the dielectric by evaporation of $Ga_2O_3$ from a solid source, the process carried out such that the integrated impurity exposure of the surface is at most 100 Langmuirs. Articles according to the invention have low interface state density ($<10^{11}/cm^2 \cdot eV$) and interface recombination velocity ($<10^4$ cm/s). Semiconductor/$Ga_2O_3$ structures according to the invention can be used advantageously in a variety of electronic or optoelectronic devices, e.g., GaAs-based MOS-FETs, HBTs, lasers on solar cells.

8 Claims, 6 Drawing Sheets

OTHER PUBLICATIONS

"In–Situ Process for AlGaAs Compound Semiconductor: Materials Science and Device Fabrication", by M. Hong et al., *Journal of Electronic Materials,* vol. 23, No. 7, 1984, pp. 625–634.

"In Situ Fabricated $Ga_2O_3$ –GaAs Structures with Low Interface Recombination Velocity", by M. Passlack et al., *Applied Physics Letters,* vol. 66 (5), 30 Jan. 1995, pp. 625–627.

"$Ga_2O_3$ Films for Electronic and Optoelectronic Applications", by M. Passlack et al., *J. Appl. Phys.,* vol. 77, No. 2, 15 Jan. 1995, pp. 686–693.

"Ammonia Plasma Passivation of GaAs in Downstream Microwave and Radio–Frequency Parallel Plate Plasma Reactors", by E. S. Aydil, *J. Vac. Science Technol. B,* vol. 11 (2), Mar./Apr. 1993, pp. 195–205.

"Physics of Semiconductor Devices", by S. M. Sze, John Wiley & Sons, 1981, New York, pp. 366–369.

ARTICLE COMPRISING A GALLIUM LAYER ON A GAAS-BASED SEMICONDUCTOR, AND METHOD OF MAKING THE ARTICLE

CROSS REFERENCE TO RELATED APPLICATION

This application is a continuation-in-part of U.S. patent application Ser. No. 08/217,332, filed Mar. 23, 1994 now U.S. Pat. No. 5,550,089.

TECHNICAL FIELD

This invention concerns electronic and optoelectronic devices that comprise a gallium oxide layer on GaAs-based semiconductor material, and methods of making the devices.

BACKGROUND OF THE INVENTION

Dielectric coatings play an important role in achieving desired performance of III–V semiconductor optoelectronic devices. Dense, closely packed thin films are required to protect the surface, such as light emitting or receiving facets, of optoelectronic devices from contamination and oxidation. Antireflection coatings (AR) are required on light emitting or receiving facets to increase the quantum efficiency of optoelectronic devices. Dielectric thin films providing low midgap interface state density are required, in particular on light emitting facets, to minimize nonradiative energy-dissipating processes such as carrier recombination via interface states. Carrier recombination is known to trigger a process at laser facets called thermal runaway causing device failure especially when operated at high optical power. Inversion channel field effect devices require dielectric films providing an unpinned Fermi level and low density of interface states below midgap (p-channel device) or above midgap (n-channel device) at the dielectric/semiconductor interface. Further, hysteresis-free. capacitance-voltage characteristics with excellent reproducibility of flatband voltage, small flatband voltage shift, and small frequency dispersion are required. Also, passivation of states on exposed surfaces of electronic III–V devices require low density of midgap interface states.

A variety of materials has been proposed for such layers including $ZrO_2$, $Al_2O_3$, $SiO_x$, $SiN_x$, $SiN_xO_y$, $Y_2O_3$ stabilized $ZrO_2$, borosilicate glass and gallium oxide. $Al_2O_3$, $SiO_x$, $SiN_x$, $SiN_xO_y$, and borosilicate glass layers are fabricated with dielectric properties, but exhibit a pinned Fermi level near midgap with a midgap state density above $10^{13}$ $cm^{-2}eV^{-1}$ when deposited on bare III–V semiconductor layers. The midgap interface state density is in a range between $7 \times 10^{11}$ $cm^{-2}eV^{-1}$ and $10^{13}$ $cm^{-2}eV^{-1}$ when deposited on GaAs samples previously treated by liquid or dry surface passivation techniques. The long term stability of liquid passivated semiconductor/dielectric interfaces under thermal stress has yet not been investigated. Furthermore, large hysteresis (at least a few volts), nonreproducible flatband voltage shifts (at least a few volts), large frequency dispersion of capacitance, and high interface state densities closer to valence or conduction band edge, did not yet allow fabrication of inversion channel field effect devices on III–V semiconductor devices. On the other hand, gallium oxide thin films deposited in an oxygen radio frequency plasma in a vacuum system, in conjunction with a GaAs surface previously treated by $H_2$ and $N_2$ plasma, allegedly give gallium oxide/GaAs interfaces with midgap density of states of about $10^{11}$ $cm^{-2}eV^{-1}$. The realization of inversion channel field effect devices has been prevented in this case by large hysteresis ($\geq 2$ V), nonreproducible flatband voltage shift (between 2 and 10 V) and leaky gallium oxide films.

It is well known to those skilled in the art that a major shortcoming of GaAs-based semiconductor materials is the typically relatively poor quality and/or instability of the semiconductor/insulator interfaces produced by prior art methods. See, for instance, W. E. Spicer et al., *J. Vac. Science and Technology*, Vol. 17(5), p. 1019 (1980), where it is stated that there will be more difficulty with "native" oxides on GaAs than on InP.

Recently, significant progress has been reported with regard to GaAs/gallium oxide interfaces. See U.S. patent application Ser. Nos. 08/217,332 and 08/217,296, both co-assigned with the instant application and incorporated herein by reference. However, the quality of even these interfaces typically still is substantially less than the quality routinely attained in the $Si/SiO_2$ system. In particular, the quality of (100) GaAs/insulator interfaces typically is still insufficient for many device applications, e.g., for GaAs-based MOS-FETs or HBTs. Indeed, there are indications that in (100)-oriented GaAs the Fermi level is pinned even if the surface is atomically clean, requiring unpinning of the Fermi level. As is well known, electronic and opto-electronic devices are almost invariably made on (100)-oriented wafers. By "quality" of the semiconductor/oxide interface we mean herein such device-relevant parameters as interface state density, interface recombination velocity, and thermochemical and photochemical stability.

In view of the advantages potentially available from GaAs-based electronic devices (e.g., FETs, HBTs) and integrated circuits, it would be highly desirable to have available a method of making a GaAs-based semiconductor/gallium oxide layer structure that can yield interfaces (especially (100)-oriented interfaces) of substantially improved quality. This application discloses such a method, as well as devices made by the method.

SUMMARY OF THE INVENTION

The invention exemplarily can be embodied in an optoelectronic III–V semiconductor device comprising a thin film coating with proper optical characteristics providing low midgap interface stlte density. The invention further can be embodied in a field effect device for inversion, depletion or accumulation channel applications on III–V semiconductors comprising a thin dielectric film providing required interface characteristics. A part of the device structure is also applicable to passivation of states on exposed surfaces of electronic III–V devices. The thin film comprises a $Ga_2O_3$ dielectric thin film, exemplarily fabricated by electron-beam evaporation of a single crystal, high purity $Gd_3Ga_5O_{12}$ complex compound on substrates kept at a temperature within a range of from 40° to 370° C. and at background pressures at or above $1 \times 10^{-10}$ Torr.

A currently preferred exemplary embodiment of the invention is a method of making an article that comprises a GaAs-based (e.g., GaAs or a ternary or quaternary III–V alloy that comprises Ga and As) semiconductor body having a major surface, and that further comprises a layer of dielectric material disposed on the major surface. At least at the semiconductor/dielectric interface the dielectric material consists essentially of $Ga_2O_3$. The method comprises providing the semiconductor body, and forming the layer of dielectric material on the major surface, said forming comprising completion (at time $t_m$) of a first monolayer of the dielectric material on the major surface.

Significantly, the major surface is prepared (e.g., by MBE growth of a semiconductor layer on a substrate body, and/or by appropriate cleaning or cleaving in UHV) such that, at a given point ($t_c$) in time the major surface is substantially atomically clean. Herein, a non-(100) on non-(111) surface (e.g., (110)) is considered to be "substantially atomically clean" if the Fermi level at the surface can be moved freely to any energy within the bandgap. Whether or not the Fermi level at the surface is free to move can be determined, in situ, by a known method, namely, photoemission spectroscopy. See, for instance, P. Skeath et al., *J. Vacuum Science and Technology*, Vol. 16, 1143 (1979), and W. E. Spicer et al., op. cit. The above condition typically cannot be applied to a (100)-surface. Thus, a (100)-oriented surface is considered to be "substantially atomically clean" if surface coverage by impurity atoms is less than (typically substantially less than) 1% of a monolayer, preferably less than 0.1% of a monolayer. The degree of coverage by impurity atoms can be measured by a known technique (XPS). See, for instance, P. Pianetta et al., *Phys. Rev. Letters*, Vol. 35 (20), p. 1356 (1975).

Furthermore, at least during the period from $t_c$ to $t_m$, the semiconductor body is maintained in a reduced pressure atmosphere (typically UHV), the conditions (time, pressure, temperature, etc.) selected such that, at time $t=t_m$, the coverage of the surface with impurity atoms is less than 1% of a monolayer. Exemplarily, this condition is typically met if the pressure p(t) is selected such that $$\int_{t_c}^{t_m}$$

p(t) dt is at most 100 Langmuir. A "Langmuir" is a conventional measure of surface exposure, namely $1\times10^{-6}$ Torr·seconds. In preferred embodiments the value of the integral is less than 50, even less than 10 Langmuir. It will be appreciated that p(t) is the pressure due to impurity species such as $O_2$, CO, $H_2O$, and does not include the pressure due to growth species or surface stabilizers such as As.

GaAs-based semiconductor/$Ga_2O_3$ interfaces formed according to the invention not only can have very low density of interface states (exemplarily<$10^{11}/cm^2 \cdot eV$) and low surface recombination velocity (exemplarily<$10^4$ cm/s), with inversion observed in both n-type and p-type material, but also have high thermochemical and photochemical stability. These values pertain to room temperature (20° C.). All of these advantageous properties are observed on (100)-oriented interfaces, and thus are directly applicable to electronic devices such as MOS-FETs, HBTs and solar cells, as well as to opto-electronic devices such as lasers, LEDs and detectors. The invention however is not limited to (100)-oriented surfaces.

It will be appreciated that, for purposes of illustration, these figures are not necessarily drawn to scale.

DETAILED DESCRIPTION OF THE INVENTION

Figure 1:
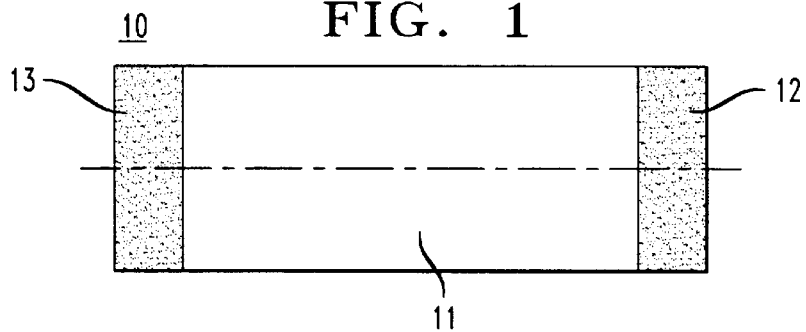
FIG. 1 is a side schematic view of a III–V or II–VI semiconductor device in accordance with an aspect of one embodiment of the invention.

A semiconductor device embodying one aspect of the invention is schematically represented in FIG. 1. The device, 10, can be any III–V laser, light-emitting, diode or photodetector. This laser could be a GaAs-based distributed feedback (DFB) laser, channeled-substrate buried heterostructure (CSBH) laser or a ridge waveguide quantum well laser. Such structures are well known in the art and, consequently, are not shown or discussed in detail.

In an exemplary embodiment, device 10 is a ridge waveguide quantum well laser. Formed on one mirror facet of semiconductor laser body, 11, is a coating, 12, which in this example is an anti-reflection (AR) coatingly having a thickness of about $\lambda/4n$ or odd multiple thereof, where $\lambda$ is the wavelength of emitted light and n is the index of refraction of the coating. In the case of a photodetector device, $\lambda$ would be the wavelength of the received light. On the other facet is a highly reflective coating (HR), 13, of a suitable material such as alternate layers of Si and $Ga_2O_3$. As a result of these two coatings, the laser is capable of emitting a higher power beam from the AR-coated facet than would be the case of an uncoated facet. In a ridge waveguide laser, a residual reflectivity of from 1 to 10 percent is desirable on the AR coated facet. If the laser is of a DFB type, the AR coating will also suppress the normal Fabry-Perot modes of the laser cavity so that a single longitudinal mode emission is produced. In systems where the laser is optically pumped, both laser facets could be coated with the AR layer so that a laser amplifier is produced. $Ga_2O_3$ layer 12 can also act as a coating which does not change the reflectivity if the thickness is deposited as an even multiple of $\lambda/2n$. Such a coating is called a passivation coating. In such cases, both facets are coated, and the layer serves to prevent degradation of the facets which might occur due to operation at high optical powers or the application of higher than normal current pulses.

In accordance with a feature of the invention, the coating, whether used as an AR, HR or passivation layer, comprises $Ga_2O_3$ exemplarily deposited by electron beam evaporation. High quality, dielectric $Ga_2O_3$ thin films are exemplarily deposited by a technique using electron beam evaporation of a single crystal high purity $Gd_3Ga_5O_{12}$ source. The electron beam deposition is generally conducted in accordance with known techniques. See for example U.S. Pat. No. 4,749,255, which is incorporated herein by reference. The source material is provided within a standard or noble crucible contained in an evacuated evaporation chamber. Also included within the evaporation chamber are a source of electrons and a holder for supporting at least one semiconductor body facets of which are to be coated. The beam of electrons is directed to the source material to cause evaporation of the material and deposition on the to be coated surfaces. Electron beam evaporation provides no significant damages to the semiconductor surface and permits in-situ monitoring of the layer thickness.

In a particular example, a number of ridge waveguide lasers with a InGaAs/GaAs structure, which comprise InGaAs active regions emitting light at 0.98 μm, were placed into the vacuum chamber of the evaporating apparatus. The surfaces of the lasers, other than the mirror facets to be coated with $Ga_2O_3$, where covered by a mask, such as stainless steel or resist. The source for the layer to be evaporated was placed in a crucible adjacent to the filament so that an electron beam emitted by the filament would impinge on the source. The pressure in the chamber is typically at or above $1 \times 10^{-10}$ Torr.

Electron bombardment of the source material was initiated and continued until a layer of a desired thickness was evaporated onto the laser facet (or facets). Depending whether the facet coating was to be used as an AR, HR or passivating coating, the evaporated thickness is adjusted in accordance with the desired purpose. Thickness was monitored by a quartz crystal oscillator.

The facet coatings were deposited at the opposite ends of body 11 by a process for depositing gallium oxide film disclosed in the above cited '296 application. The facet coatings were deposited by electron beam evaporation of $Ga_2O_3$ using a single crystal high purity $Gd_3Ga_5O_{12}$ source. This source combines the relatively covalent oxide $Ga_2O_3$, which volatilizes near 2000K, and the pretransition oxide $Gd_2O_3$ which has a boiling point (>4000K) well above the forgoing temperature. The more complex compound $Gd_3Ga_5O_{12}$ (melting point ~2000K) decrepitates during heating, slowly releasing high purity $Ga_2O_3$. The background pressure in the evaporation chamber (no bleeding in of $O_2$) was $1–2 \times 10^{-6}$ Torr. Background pressures as low as $1 \times 10^{-10}$ or $1 \times 10^{-11}$ are possible. The deposition rate, which was maintained at 0.05 nm/s, and the film thickness were measured during deposition by a crystal thickness monitor.

Using this method, the facets of ridge-waveguide $In_{0.2}Ga_{0.8}As$/GaAs quantum well lasers were coated with high quality $Ga_2O_3$ films. The deposited $Ga_2O_3$ films show an excellent homogeneity. This was demonstrated by Auger depth profiling as described in the above-identified copending U.S. application. The measurements also show, within the limits of Auger spectroscopy, that the films are stoichiometric. No impurities could be detected by Auger analysis (sensitivity 0.1%) including Gd, which is considered to be the dominant impurity in our $Ga_2O_3$ films. The Gd content estimated by SIMS was of the order of 0.1%.

Optical and electrical properties of $Ga_2O_3$ films were determined before these films were used for coating laser facets. For this purpose, homogeneous, high quality dielectric $Ga_2O_3$ films with thicknesses between 4 and 400 nm were deposited a) on Si wafers covered by a 90 nm thick TiW layer, b) on $n^+$ GaAs substrates, and c) on fused silica in order to determine electrical and optical properties of these films. Subsequently, laser facets were coated at substrate temperatures $T_S$ of below 50° C., such as 40° C. with no excess oxygen, and below 150° C., such as 125° C., with an oxygen partial pressure of $p_{ox}=2 \times 10^{-4}$ Torr in the evaporation chamber. The index of refraction was determined by reflection, transmission, and ellipsometry measurements. The transmission of $Ga_2O_3$ films on fused silica samples was measured by a tungsten halogen lamp in conjunction with a monochronometer. Reflectivity measurements were made using an Anritsu optical spectrum analyzer MS9001B1 and a tungsten halogen lamp. The wavelength was scanned between 0.6 and 1.2 μm and the results of both transmission and reflection measurements were subsequently fitted to a theoretical model for an absorbing dielectric film.

In a particular example, GaAs based ridge waveguide lasers structures emitting at 980 nm were investigated. The exemplary ridge waveguide laser comprises an 80 Å thick $In_{0.2}Ga_{0.8}As$ quantum well active region, 0.1 μm thick undoped GaAs optical confinement layers, and 1.2 μm thick $Ga_{0.5}In_{0.5}P$ cladding layers. The calculated reflectivity, R, of an abrupt transition of two media with refractive index $n_1$ (air) and $n_3$ (III–V semiconducting material), respectively, separated by an anti-reflection coating with refractive index $n_2$ and a thickness of $\lambda/4n_2$, or odd multiple thereof, is given by $$R = \left[ \frac{n_1 n_3 - n_2^2}{n_1 n_3 + n_2^2} \right]^2.$$

According to foregoing equation, anti-reflection coatings (zero reflectivity) are provided by a facet coating with $n_2$=1.88, 1.80, and 1.89 on GaAs, $Ga_{0.5}In_{0.5}P$, and $In_{0.2}Ga_{0.8}As$, respectively, at 980 nm wavelength.

Figure 2:
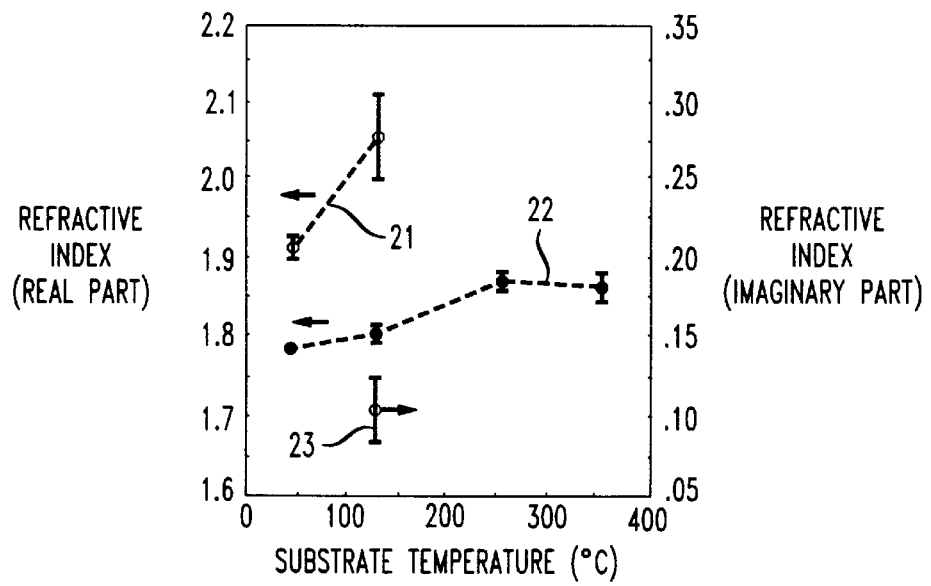
FIG. 2 is a plot of an index of refraction versus substrate temperature during deposition of $Ga_2O_3$ films.

FIG. 2 is a plot of refractive index vs. substrate temperature during deposition for $Ga_2O_3$ films deposited at a background pressure of $1–2 \times 10^{-6}$ Torr with no excess oxygen (Curve 21) and with $2 \times 10^{-4}$ Torr oxygen present (Curve 2) in the evaporation chamber. The refractive indices of $Ga_2O_3$ films deposited with $2 \times 10^{-4}$ Torr oxygen present in the evaporation chamber are 1.78, 1.80, 1.87, and 1.87 for substrate temperatures during deposition, $T_S$, of 40°, 125°, 250°, and 370° C., respectively. $Ga_2O_3$ films deposited at a background pressure of $1–2 \times 10^{-6}$ Torr with no excess oxygen show a refractive index of 1.91 when deposited at a substrate temperature of 40° C. and the refractive index is complex (2.06+i0.1) when deposited at 125° C. substrate temperature. Thus, over a wide range of deposition conditions, $Ga_2O_3$ coatings deposited by said method of fabrication, provide required refractive indices. Imaginary part of the reflective index is represented by the measurement point, 23, in FIG. 2.

Figure 3:
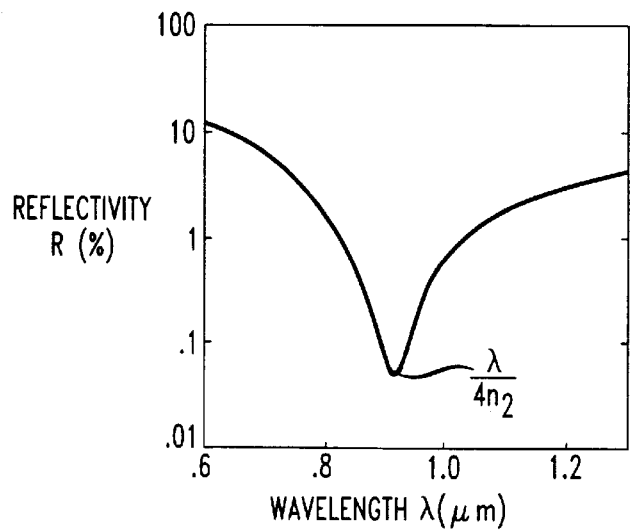
FIG. 3 is a plot of reflectivity as a function of wavelength of a 125 nm thick $Ga_2O_3$ film on GaAs.

By way of an example only, the reflectivity of a 1250 Å thick $Ga_2O_3$ layer, deposited on a GaAs substrate maintained during deposition at 125° C. with $O_2$ partial pressure of $2 \times 10^{-4}$ Torr in the evaporation chamber, was also investigated. FIG. 3 shows the corresponding plot of reflectivity vs. wavelength. Since ridge waveguide lasers require low reflectivity coatings, the thickness of the $Ga_2O_3$ coating was designed to yield a reflectivity of 0.5% at 980 nm wavelength. The minimum reflectivity is 0.05% at 907 nm wavelength with a refractive index of 1.80 of the $Ga_2O_3$ coating. Minimum reflectivities of 0.03% were measured on other samples.

Figure 4:
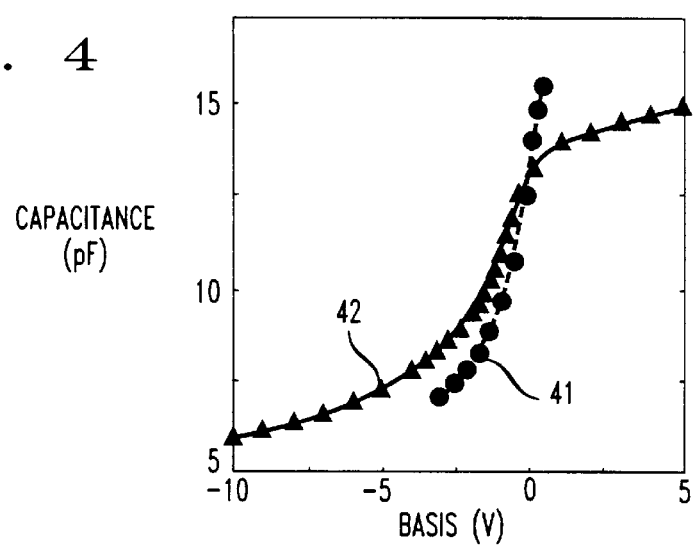
FIG. 4 is a plot of high-frequency capacitance vs. bias for Au/Ti/$Ga_2O_3$/n-type GasAs (Curve 41) and Au/Ti/$Ga_2O_3$/n-type$Ga_{0.5}P$ (Curve 42) metal/insulator/semiconductor structures measured at 300K.

FIG. 4 shows a plot of high-frequency capacitance vs. bias for Au/Ti/$Ga_2O_3$/n-type GaAs (Curve 41) and for Au/Ti/Ga$_2$O$_3$/n-type Ga$_{0.5}$In$_{0.5}$P (Curve 42) metal/insulator/semiconductor structures measured at 300K. The Ga$_2$O$_3$ films were deposited on bare substrates at substrate temperatures of 350° C. (Curve 41) and 125° C. (Curve 42) and with 2×10$^{-4}$ Torr oxygen present in the evaporation chamber. The capacitance characteristics measured at a frequency of 1 MHz at 300K, reveal an unpinned Fermi level below midgap and a midgap interface state density of about 10$^{12}$ cm$^{-2}$eV$^{-1}$ and below 10$^{11}$ cm$^{-2}$eV$^{-1}$ at GaAs/Ga$_2$O$_3$ and Ga$_{0.5}$In$_{0.5}$P/Ga$_2$O$_3$ semiconductor/dielectric interfaces, respectively. Since the interface recombination velocity is directly proportional to the midgap interface state density, energy dissipating processes such as recombination via interface states are reduced by one to two orders of magnitude compared to other coatings deposited on bare samples.

Further, an indirect measure of interface recombination velocity are measurements of photoluminescence intensity. The Ga$_2$O$_3$ coatings on bare GaAs and bare Ga$_{0.5}$In$_{0.5}$P substrates deposited at substrate temperatures of 350° C. and 125° C., respectively, and with 2×10$^{-4}$ Torr oxygen present in the evaporation chamber, lead to an increase in photoluminescence intensity by a factor of 1.4 to 1.7 compared to identical uncoated samples. Other coatings such as Al$_2$O$_3$, SiO$_x$, SiN$_x$, ZrO$_2$ and Y$_2$O$_3$ stabilized ZrO$_2$, deposited on bare GaAs samples, do not cause an increase in photoluminescence intensity compared to uncoated GaAs samples.

Figure 5:
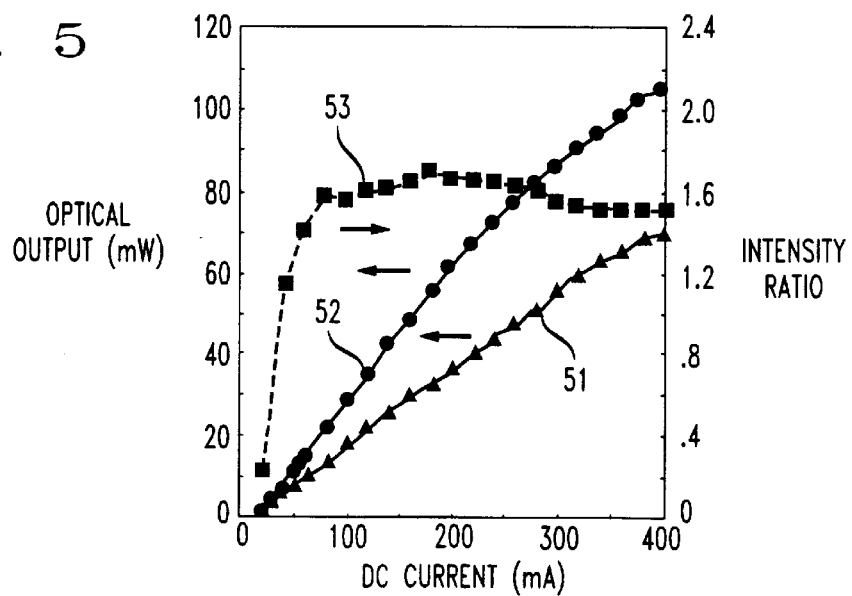
FIG. 5 is a plot of the optical output as a function of dc current for a ridge waveguide $In_{0.2}Ga_{0.8}As$/GaAs quantum well laser emitting at 0.98 $\mu$m before (Curve 51) and after (Curve 52) facet coating.

FIG. 5 shows a plot of the optical output as a function of dc current for a ridge-waveguide In$_{0.2}$Ga$_{0.8}$As/GaAs quantum well laser emitting at 0.98 μm before (Curve 51) and after (Curve 52) facet coating. The ridge of this laser is 5 μm wide and 500 μm long. The facets of the laser were coated with Ga$_2$O$_3$ films deposited at substrate temperatures of 125° C. with an oxygen partial pressure of 2×10$^{-4}$ Torr in the evaporation chamber. Prior to film deposition, the laser facets were cleaned by ethyl alcohol. The thickness of the front facet coating was 125 nm, which gives a measured and calculated reflectivity of 0.5% and 0.75%, respectively. A thin protective layer, 35 nm thick, (thickness<<λ/(4n$_2$) with a measured reflectivity of 29% was deposited on the back facet. The intensity ratio (Curve 53) characterizes the relation between the external optical intensities at the front facet after and before coating. The differential quantum efficiency increases by 51% after facet coating.

It will be appreciated that although the specific examples above describe coating of laser facets, the invention is also useful for coating surfaces of the light-emitting devices such as light-emitting diodes and photodetectors. Although the device structures were formed in GaAs substrates with multi-layer of InP, InGaAs and GaAs, the invention should be generally applicable to III–V semiconductor materials, whether binary, ternary or quaternary, and could be applied to structures including II–VI semiconductors.

Figure 6:
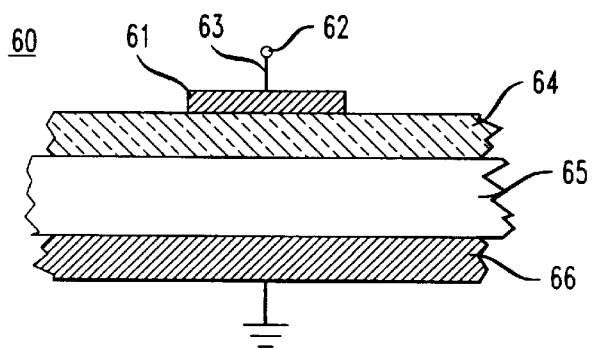
FIG. 6 is a schematic representation of a field effect device for inversion channel applications.

This invention further concerns III–V semiconductor electronic devices, especially field-effect devices for inversion channel applications and passivation of states on exposed surfaces of electronic devices. FIG. 6 is a schematic representation of a field effect device, 60, for inversion channel applications comprising means to apply a control voltage or bias to a metal field plate 61 including electrical terminal 62 and conductor 63. A dielectric thin film 64 comprises a uniform, homogeneous, dense, dielectric Ga$_2$O$_3$ layer deposited ex situ or in situ by electron-beam evaporation of a single crystal, high purity Gd$_3$Ga$_5$O$_{12}$ complex compound. The term in situ (in contrast to ex situ) exemplarily characterizes the deposition of said dielectric Ga$_2$O$_3$ thin film on a MBE grown semiconducting layer without leaving the UHV environment. The III–V semiconductor 65 is of weak n-type or of weak p-type for p-inversion channel and n-inversion channel applications, respectively. An ohmic contact 66 completes the circuit. The operation principles of such devices are well known from Si-MOSFET technology and consequently, are not discussed in detail (see, for example, S. M. Sze, "Physics of semiconductor devices", John Wiley & Sons, page 366, New York 1981).

Figure 7:
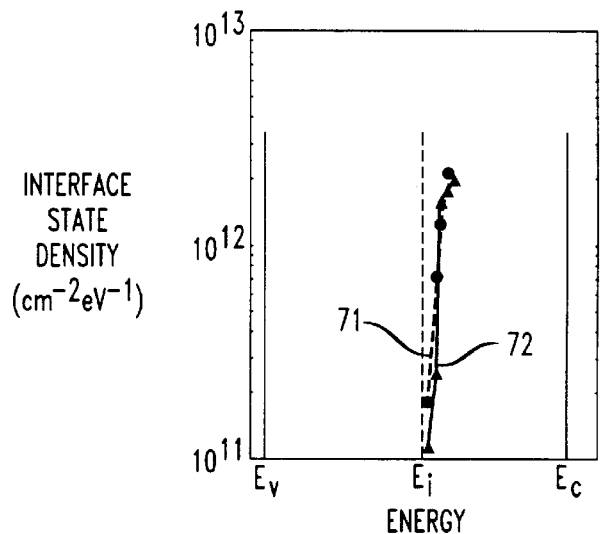
FIG. 7 is a plot of interface state density vs. bandgap energy of the field-effect device illustrated in FIG. 6, produced under one type of deposition parameters.

In a particular example, the Ga$_2$O$_3$ thin films were ex situ deposited on bare n-type GaAs substrates by said the above described method of fabrication. The GaAs substrates were maintained during deposition at 350° C. with O$_2$ partial pressure of 2×10$^{-4}$ Torr in the evaporation chamber. The device was completed by fabricating Au/Ti dots 61 of different diameters (50, 100, 200, 500 μm) on top of Ga$_2$O$_3$ thin films 64 by evaporation through a shadow mask and by providing an Ohmic backside contact 66. High-frequency (1 MHz) capacitance voltage measurements revealed an unpinned Fermi level below midgap, excellent reproducibility of flatband voltage and no detectable flatband voltage shift. Hysteresis was very small, typically a few tens of millivolts or less. FIG. 7 is a plot of corresponding interface state density vs. bandgap energy with substrate doping concentration of 1.6×10$^{16}$ cm$^{-3}$ (Curve 71), and 8.6×10$^{16}$ cm$^{-3}$ (Curve 72). Interface states D$_{it}$ were not detectable below midgap by high frequency measurements using Terman's method $$D_{it}(\psi_{so}) = \frac{C_1}{q^2} \left( \frac{dV^*}{d\psi_S} - \frac{dV}{d\psi_S} \right)_{\psi_S = \psi_{SO}}$$

where C$_i$ is the capacitance of the dielectric layer per unit area, q is the unit charge, V* and V are the measured and calculated bias points, respectively, at the same semiconductor surface potential $\psi_S = \psi_{SO}$, i.e. at identical high frequency capacitances (T. M. Terman, "An investigation of surface states at a silicon/silicon oxide interface employing metal-oxide-silicon diodes", Solid-State Elect., Vol. 5, page 285 (1962)). The resolution limit of this method is about 10$^{11}$ cm$^{-2}$eV$^{-1}$. The midgap interface state density determined from FIG. 7 is below 10$^{12}$ cm$^{-2}$eV$^{-1}$.

Figure 8:
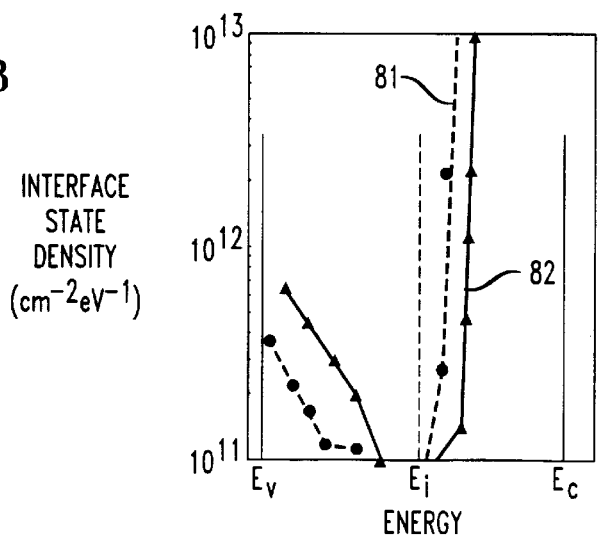
FIG. 8 is a plot of interface state density vs. bandgap energy of the field-effect device shown in FIG. 6, produced under different type of deposition parameters.

In another example, the Ga$_2$O$_3$ thin films were ex situ deposited on bare n-type Ga$_{0.5}$In$_{0.5}$P substrates by the above described method of fabrication. The GaAs substrates were maintained during deposition at 125° C. with O$_2$ partial pressure of 2×10$^{-4}$ Torr in the evaporation chamber. Specific resistivity, dielectric constant and dc breakdown field of said Ga$_2$O$_3$ thin film are 4×10$^{12}$ Ω cm, 10.2, and 1.91 MV/cm. Frequency dispersion of capacitance was less than 5% below midgap within the measurement range between 500 Hz and 1 MHz. Again, high-frequency (1 MHz) capacitance voltage measurements revealed an unpinned Fermi level below midgap, excellent reproducibility of flatband voltage and no detectable flatband voltage shift. Hysteresis was very small, typically a few tens of millivolts or less. FIG. 8 is a plot of corresponding interface state density vs. bandgap energy with substrate doping concentration of 3×10$^{16}$ cm$^{-3}$ (Curve 81), and 3×10$^{17}$ cm$^{-3}$ (Curve 82). The midgap interface state density is well below 10$^{11}$ cm$^{-2}$eV$^{-1}$ and the interface state density increases toward the valence band edge to values typically found at the excellent Si/SiO$_2$ interface.

As demonstrated in both examples, the disclosed field effect device meets all requirements such as unpinned Fermi level, very low density of interface states below midgap (p-inversion channel), excellent reproducibility of flatband voltage, no detectable flatband voltage shift, small hysteresis (typically a few tens of millivolts or less), and small frequency dispersion of capacitance between 500 Hz and 1 MHz (less than 5%) for inversion channel applications.

Further, $Ga_2O_3$ thin films deposited by said fabrication method are useful for passivation of states on exposed surfaces of any kind of electronic III–V devices. The interface recombination velocity is directly proportional to the midgap interface state density. Since the demonstrated midgap interface state density is below $10^{12}$ cm$^{-2}$eV$^{-1}$ and well below $10^{11}$ cm$^{-2}$eV$^{-1}$ at GaAs/$Ga_2O_3$ and $Ga_{0.5}In_{0.5}P$/$Ga_2O_3$ interfaces, respectively, the device performance and reliability are improved by small interface recombination velocities.

Various additional modifications will become apparent to those skilled in the art. All such variations which basically rely on the teachings through which the invention has advanced the art are properly considered within the scope of the invention.

It has to be emphasized that many of the above-disclosed experimental conditions are exemplary only. For instance, single crystal $Gd_3Ga_5O_{12}$ is not the only possible source material, merely a convenient one that was readily available to us. As those skilled in the art well know, the chemical properties of the rare earths (atomic number 57–71) and Y closely resemble each other, and a source material in which Gd is completely or partially replaced by another rare earth or Y is likely to be useful in the practice of the invention. Furthermore, use of pure gallium oxide is contemplated, if the oxide becomes more readily available in pure crystalline form. Indeed use of a single crystal form is optional, provided the source material is sufficiently free of contaminants such as $CO_2$ and $H_2O$.

Furthermore, e-beam deposition is not the only possible deposition method. Indeed, any method (e.g., use of an effusion cell) that is compatible with maintenance of a clean, undamaged semiconductor surface is contemplated. Still furthermore, useful substrate temperatures are not limited to the range 40°–370° C., and the background pressure is not limited to $1 \times 10^{-10}$ Torr and above. Indeed, we have discovered that maintenance of the atomically clean semiconductor surface at UHV pressure can result in substantial improvement in interface quality.

We have discovered that, by providing a substantially atomically clean (typically (100)-oriented) surface of a GaAs-based semiconductor body, and by appropriately limiting exposure of the surface to oxygen and other contaminants prior to completion of the first monolayer of dielectric material on the surface, GaAs-based semiconductor/$Ga_2O_3$ layer structures having greatly improved interface characteristics can be produced. According to our present understanding, the exposure of the surface to impurities is such that, at $t_m$, impurity coverage of the surface is less than 1% of a monolayer, exemplarily such that the exposure of the surface to impurities is at most 100 Langmuirs (preferably less than 50 or 10 Langmuir. Our measurements to date have not revealed a significant difference in interface quality between structures that had exposures of 100 Langmuirs and 10 Langmuirs, respectively, although the existence of a difference cannot be ruled out. However, we expect that exposure substantially in excess of 100 Langmuirs will result in reduced quality interfaces.

Although in principle any apparatus that can provide the substantially atomically clean surface at $t=t_c$, and the required low exposure during the time from $t_c$ to $t_m$ is potentially suitable for the practice of the invention, in practice the apparatus typically will comprise one or more UHV chambers. In the case of multichamber apparatus, two chambers will generally be linked together by a transfer module which facilitates transfer of the semiconductor body from one chamber to the other without exposure of the body to the ambient atmosphere. Typically the transfer is under UHV conditions. Such apparatus is known. See, for instance, M. Hong et al., *J. Electronic Materials*, Vol. 23, 625 (1994).

Exemplarily, our apparatus comprises a MBE growth chamber (background pressure typically about $2 \times 10^{-11}$ Torr), a dielectric film deposition chamber (typically about $1 \times 10^{-10}$ Torr), and a transfer module (typically about $6 \times 10^{-11}$ Torr) that links the former chambers.

In an exemplary embodiment of the inventive method, a conventional (100)-oriented GaAs substrate was introduced into the MBE growth chamber, and a 1.5 $\mu$m thick GaAs n-type ($2 \times 10^{16}$ cm$^{-3}$) layer was grown by conventional MBE on the wafer. After completion of GaAs growth and cool-down, the wafer was transferred under UHV to the dielectric growth chamber. Following the transfer the wafer was heated in UHV to 400° C., and the dielectric layer deposited substantially as described above. During deposition the pressure in the chamber unavoidably increased to about $3 \times 10^{-7}$ Torr. According to our present understanding, the interface properties are substantially fixed as soon as the first monolayer of the dielectric has been deposited.

Figure 9:
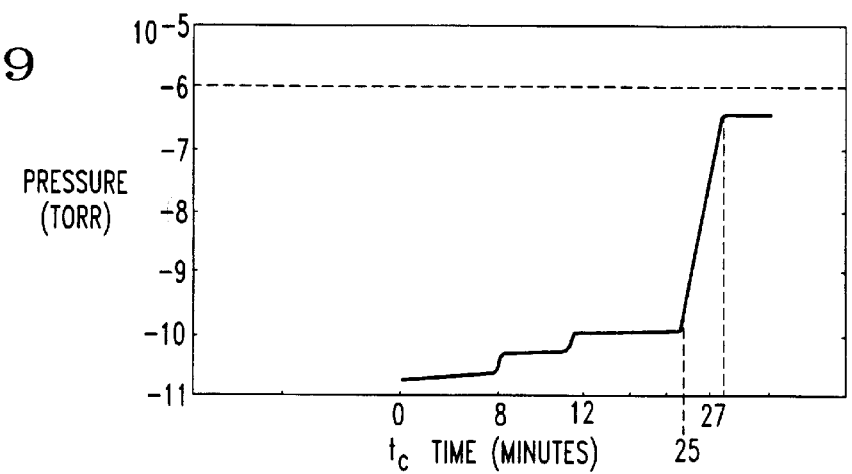
FIG. 9 shows exemplary data on vacuum pressure vs. time during the relevant portion of the process of forming a $Ga_2O_3$ layer on (100) GaAs.

FIG. 9 shows a schematic curve of pressure vs. time during manufacture in our apparatus of an exemplary GaAs/$Ga_2O_3$ structure according to the invention. The $Ga_2O_3$ growth rate was 0.016 nm/s. As can be readily verified, the total exposure was less than about 10 Langmuir. In FIG. 9, the time of completion of the substantially atomically clean (100)-oriented GaAs surface ($t_c$) is taken to correspond to the origin of the time axis. The period from $t=0$ to $t=t_m$ comprises the time (about 8 minutes) required for the wafer to cool from the GaAs deposition temperature (e.g., 600° C.) to about 200° C., the time (about 4 minutes) required to transfer the wafer in UHV from the GaAs deposition chamber to the $Ga_2O_3$ deposition chamber, and the time (about 13 minutes) to heat the wafer to the appropriate deposition temperature (e.g., 400° C.). As those skilled in the art will appreciate, the pressure in the chamber unavoidably rises during deposition above the background pressure. However, in our apparatus completion of the first monolayer of the oxide typically takes only a few seconds (the exact value depending on the deposition rate). During MBE deposition of the GaAs layer the $O_2$ pressure was below the detection limit, and the total background pressure was about $2 \times 10^{-11}$ Torr.

Figure 10:
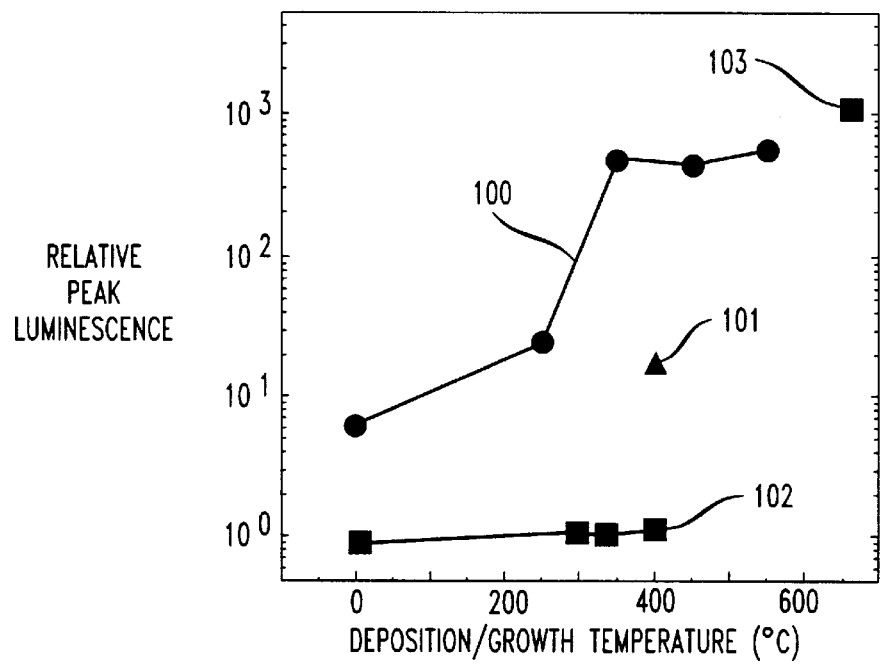
FIG. 10 shows exemplary comparative data on photoluminescence vs. deposition temperature.

FIG. 10 shows exemplary data (curve 100 and data point 101) on relative peak luminescence vs. dielectric growth temperature for GaAs/$Ga_2O_3$ interfaces according to the invention, as well as analogous comparison data for an exemplary GaAs/MgO interface (curve 102) and for a GaAs/AlGaAs interface (data point 103). The latter interface had a measured interface state density of $2 \times 10^9$/cm$^2$eV, and had peak luminescence only marginally larger than that of some GaAs/$Ga_2O_3$ interfaces according to the invention, indicative of the low value (e.g., $<10^{11}$/cm$^2$.eV for deposition temperature >200° C.) of interface state density obtainable by the method according to the invention. The low values of interface state density are indicative of low values (e.g., $10^3$–$10^4$ cm/s) of recombination velocity, as those skilled in the art will appreciate.

Curve 100 refers to As-stablized C(2×4) GaAs surfaces, whereas data point 101 refers to a Ga-stabilized C(4×2) GaAs surface. The data illustrates the typically substantially higher quality of As-stabilized (100) GaAs/$Ga_2O_3$ interfaces, as compared to analogous Ga-stabilized interfaces. Consequently, currently preferred embodiments of the invention comprise As-stabilization of the GaAs surface.

Exemplarily, this is done by maintaining the As flux after termination of the Ga flux until the sample has cooled to 500° C., and turning the sample surface. The luminescence was excited by laser radiation (λ=514.5 nm, power density 50 W/cm²).

Figure 11:
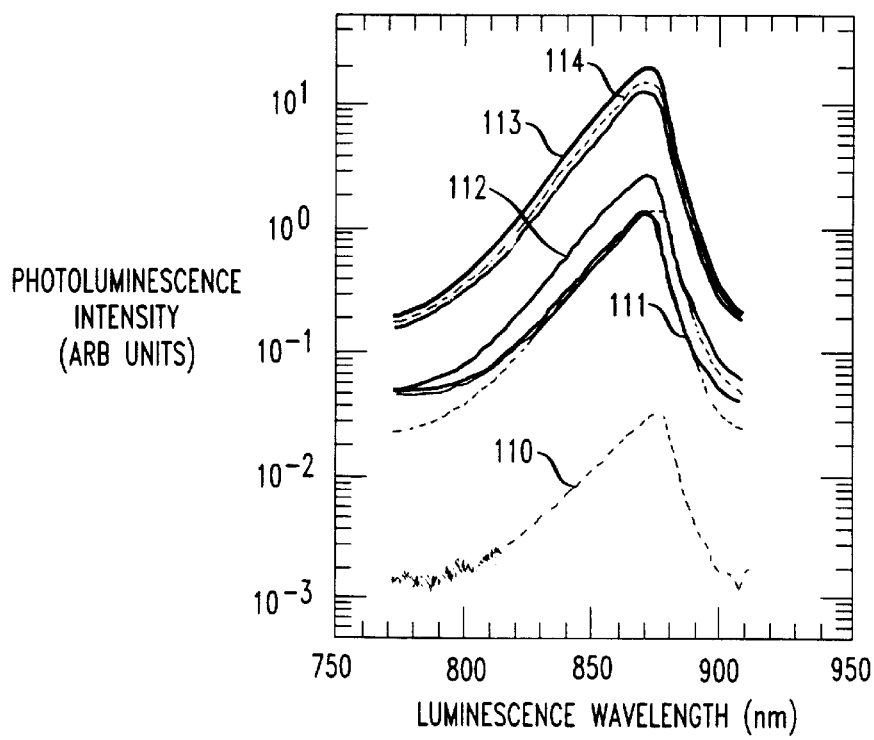
FIGS. 11 and 12 shows photoluminescence data that illustrate, respectively, the thermochemical and photochemical stability of interfaces formed according to the invention.

FIG. 11 shows exemplary photoluminescence data that demonstrates the surprisingly high thermochemical stability of GaAs/Ga$_2$O$_3$ interfaces according to the invention. Curve 110 was obtained from bare GaAs and is provided for comparison purposes. The remaining curves were obtained from (100) GaAs/Ga$_2$O$_3$ structures according to the invention that were annealed for 120 seconds in forming gas. The structures were substantially identical, all having a 26.2 nm SiO$_2$ cap layer for purposes of the annealing experiment. The parameter that distinguishes curves in FIG. 11 is the annealing temperature. Curves 111 pertain to 800° and 900° C., 112 to 750° and 1000° C., 113 to 700° C., 114 to 650° C., with the remaining curves (which are almost identical) pertaining to 400°, 500°, 550° and 600° C., and to an as-deposited structure.

Figure 12:
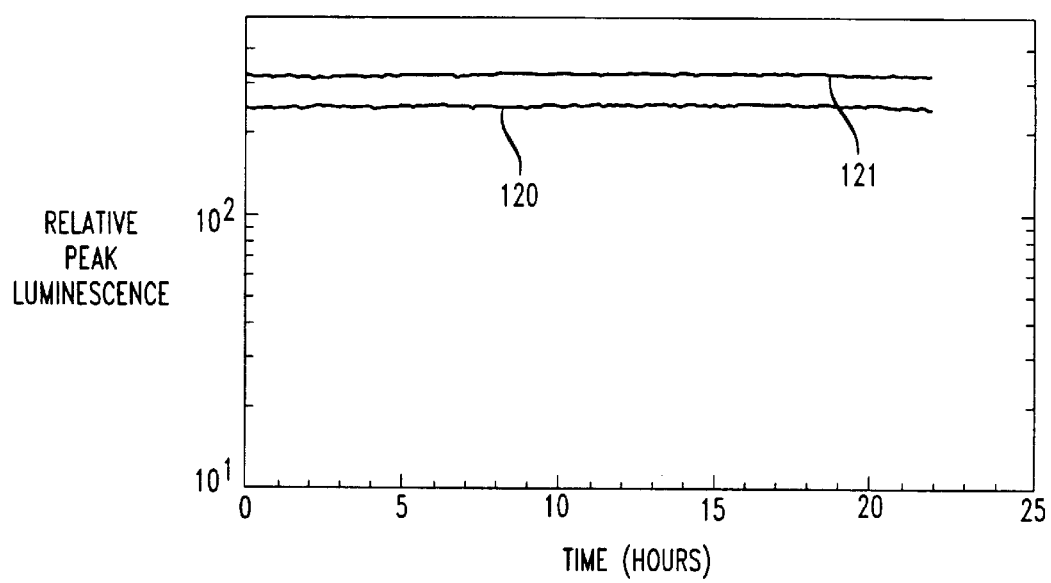

FIG. 12 shows exemplary photoluminescence data that demonstrates the photochemical stability of an exemplary GaAs/Ga$_2$O$_3$ interface according to the invention. Curve 120 pertains to a structure that was annealed at 1000° C. for 30 seconds in forming gas, and curve 121 pertains to an analogous as-deposited structure.

Figure 13:
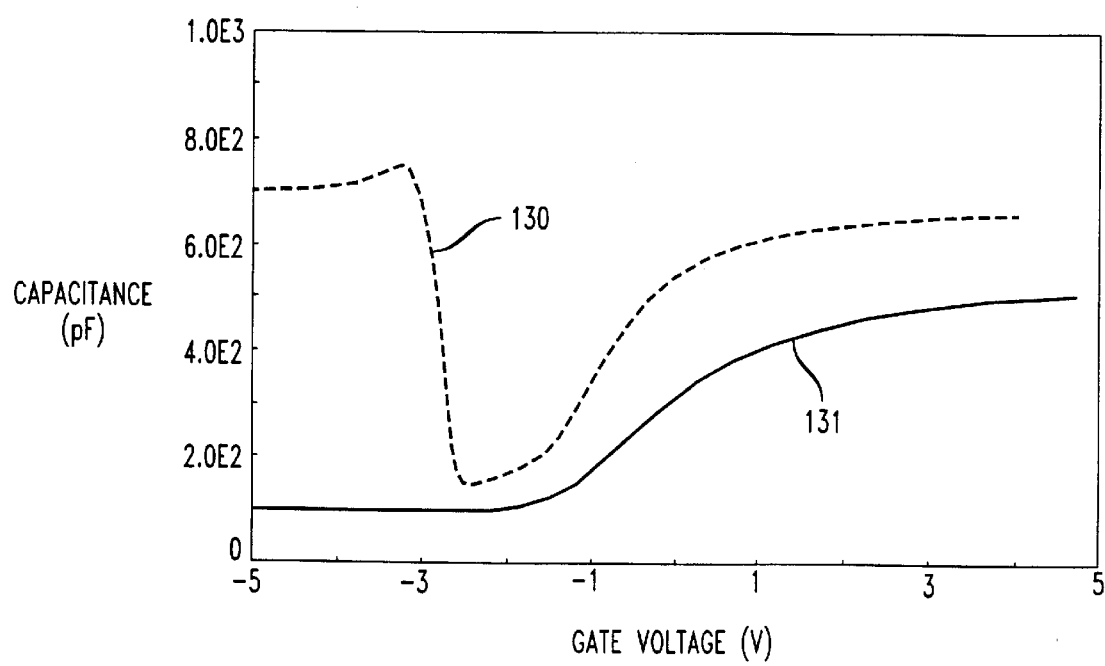
FIG. 13 presents exemplary data on capacitance vs. gate voltage of a MOS structure according to the invention.

FIG. 13 presents exemplary capacitance vs. gate voltage data for a MOS structure according to the invention, with curve 130 showing the quasi-static response, and curve 131 showing the high frequency (100 kHz and 1 MHz) response. The oxide thickness was 46 nm, the contact size was $2\times10^{-3}$ cm², the semiconductor was n-type ($2\times10^{16}$ cm$^{-3}$), and the sweep rate was 100 mV/s. As those skilled in the art will recognize, the data of FIG. 13 demonstrates the existence of inversion as well as of accumulation. The existence of frequency dispersion of the Ga$_2$O$_3$ dielectric constant should be noted.

Figure 14:
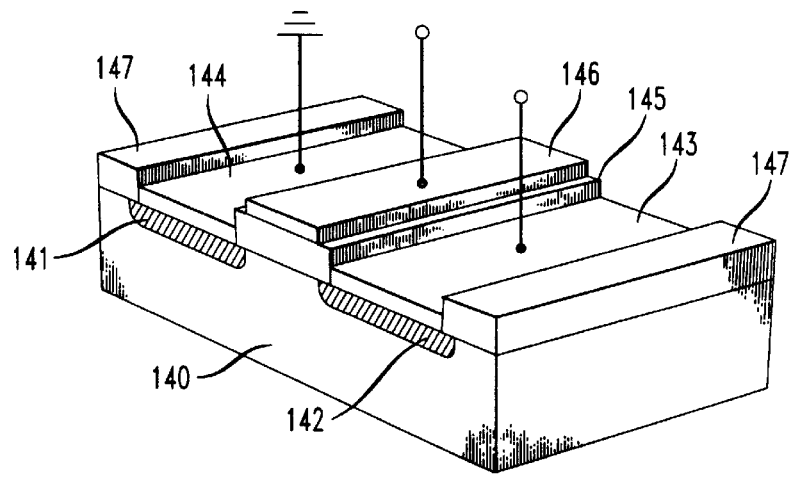
FIGS. 14–16 schematically depict exemplary devices according to the invention, namely, a MOS-FET, a HBT and a solar cell, respectively.

FIG. 14 schematically depicts an exemplary electronic device according to the invention, namely, a GaAs-based MOS-FET. Numerals 140–147 refer, respectively, to the GaAs body (exemplarily p-type), the source region (exemplarily n-type), the drain region (exemplarily n-type), the drain contact, the source contact, the Ga$_2$O$_3$ gate oxide, the gate contact and the field oxide (optionally also Ga$_2$O$_3$). Associated with the interface between 140 and 145 is an interface state density<$10^{11}$/cm².eV, and typically a recombination velocity<$10^4$ cm/s.

Figure 15:
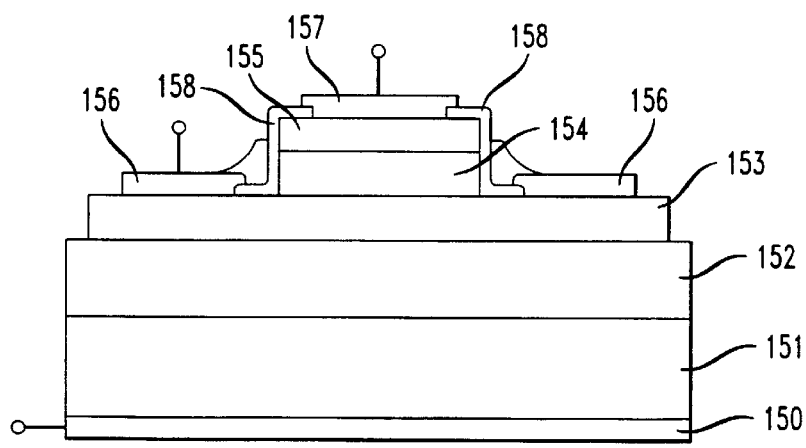

FIG. 15 schematically depicts another exemplary electronic device according to the invention, namely, a GaAs-based HBT. Numerals 150–158 refer, respectively, to the collector contact, the GaAs substrate (typically n$^+$), the GaAs collector layer (typically n$^-$), the GaAs base layer (typically p$^+$), the emitter layer (exemplarily n-type graded AlGaAs), the emitter contact layer (exemplarily n$^+$ AlGaAs), the base contact, the emitter contact and the Ga$_2$O$_3$ passivation layer. Associated with the interface between the semiconductor material and oxide layer 158 are the above specified characterization.

Figure 16:
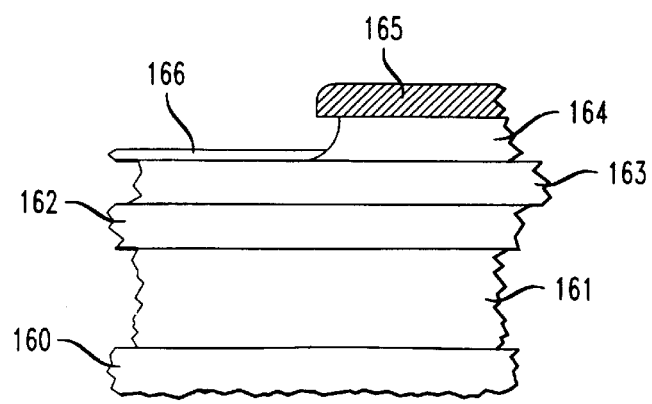

FIG. 16 schematically depicts an exemplary optoelectronic device according to the invention, namely, a GaAs-based solar cell with Ga$_2$O$_3$ antireflection coating. Numerals 160–166 refer, respectively, to the substrate (e.g., GaAs), an n-GaAs layer, a p-GaAs layer, a p$^+$-AlGaAs layer, a p$^+$GaAs contact layer, a metallization layer, and Ga$_2$O$_3$ AR layer. The interface between 163 and 166 has the above specified characteristics.

Those skilled in the art will appreciate that in general devices according to the invention are structurally similar or identical to the corresponding (existing or proposed) prior art structures. However, due to the presence of the high quality GaAs/Ga$_2$O$_3$ interface that can be produced by the inventive method, these devices will have substantially improved characteristics. For instance, in a HBT according to the invention the presence of the improved Ga$_2$O$_3$ passivation layer will result in significantly reduced recombination in the extrinsic base region, with attendant improvement in device characteristics.

Analysis of GaAs/Ga$_2$O$_3$ structures according to the invention that comprise a dielectric layer deposited as described above (i.e., using a Gd$_3$Ga$_5$O$_{12}$ source) has revealed the presence of a significant amount of Gd in the dielectric layer. The Gd concentration is typically highest at or near the surface of the dielectric layer, but is substantially (e.g., by up to three orders of magnitude) less close to the semiconductor/dielectric interface. Due to experimental limitations the dielectric composition directly at the interface has not been determined, but is expected to be essentially pure Ga$_2$O$_3$, with at most about 100 ppm of Gd.

The invention claimed is:

1. A method of making an article that comprises a GaAs-based semiconductor body having a major surface, and that further comprises a layer of dielectric material on at least a portion of said major surface, at least the dielectric material at the dielectric/semiconductor interface consisting essentially of Ga$_2$O$_3$, the method comprising a) providing the semiconductor body; and b) forming the layer of dielectric material on the major surface, said forming comprising completion, at a time $t_m$, of a first monolayer of dielectric material on the major surface; and the method further comprises c) preparing, prior to the forming step, the major surface such that, at a given point $t_c$ in time, at least said portion of the major surface is substantially atomically clean; and d) maintaining, at least from $t_c$ to $t_m$, the semiconductor body in a reduced pressure atmosphere selected such that, at $t_m$, the impurity coverage of the surface is less than 1% of a monolayer.

2. Method of claim 1, wherein the reduced pressure atmosphere is selected such that $$\int_{t_c}^{t_m}$$

p(t)dt is at most 100 Langmuirs, where p(t) is the impurity pressure of the reduced pressure atmosphere as a function of time.

3. Method of claim 1, wherein the major surface is (100)-oriented.

4. Method of claim 3, wherein the semiconductor body has composition GaAs at least at the dielectric/semiconductor interface.

5. Method of claim 1, wherein the semiconductor body comprises a GaAs layer formed in a first growth chamber, and wherein the method comprises transferring the semiconductor body from the first growth chamber to a second growth chamber through a vacuum chamber that connects the first and second growth chambers.

6. Method of claim 4, wherein the method is selected such that the major surface is a As-stabilized GaAs surface.

7. Method of claim 6, wherein the As-stabilized GaAs surface is a (100)-oriented C(4×2) surface.

8. Method of claim 1, wherein the major surface is (110)-oriented.

* * * * *